(12) United States Patent
Jalabert (10) Patent No.: US 7,593,251 B2
(45) Date of Patent: Sep. 22, 2009

(54) MEMORY CELL COMPRISING A MOLECULAR TRANSISTOR, DEVICE COMPRISING A PLURALITY OF SUCH CELLS AND METHOD FOR USING SAME

(75) Inventor: Antoine Jalabert, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 77 days.

(21) Appl. No.: 11/798,598

(22) Filed: May 15, 2007

(65) Prior Publication Data

US 2008/0031034 A1   Feb. 7, 2008

(30) Foreign Application Priority Data

Aug. 3, 2006   (FR)   .................................. 06 07087

(51) Int. Cl.
*G11C 11/00* (2006.01)
(52) U.S. Cl. .................................. 365/151; 365/185.28
(58) Field of Classification Search ................ 365/151, 365/185.28
See application file for complete search history.

(56) References Cited

U.S. PATENT DOCUMENTS

| | | |
|---|---|---|
| 6,944,047 B2 | 9/2005 | Rotenberg et al. |
| 2003/0178617 A1 | 9/2003 | Appenzeller et al. |
| 2003/0206436 A1 | 11/2003 | Eaton, Jr. et al. |
| 2004/0202025 A1* | 10/2004 | Seki et al. ............. 365/185.29 |
| 2005/0051805 A1 | 3/2005 | Kim et al. |
| 2005/0056826 A1 | 3/2005 | Appenzeller et al. |
| 2007/0242523 A1* | 10/2007 | Liao et al. ............. 365/185.28 |

FOREIGN PATENT DOCUMENTS

EP   1 508 926 A1   2/2005

OTHER PUBLICATIONS http:/si.epfl.ch/page17396.html, Centre des Systemes Integres, 2005-2006 seminars.*
Design and Technology Interaction, Amara et al., six (6) pertinent pages.*
Li et al., "multilevel Memory Based on Molecular Devices," Mar. 2004, Applied Physics Letters, vol. 84, No. 11, all pages are pertinent.*
Li, C. et al. "Multilevel Memory Based on Molecular Devices," *Applied Physics Letters*, vol. 84, No. 11, pp. 1949-1951 (2004).

(Continued)

*Primary Examiner*—Hoai V Ho
*Assistant Examiner*—Fernando N Hidalgo
(74) *Attorney, Agent, or Firm*—Oliff & Berridge, PLC (57) ABSTRACT

The memory cell comprises a field effect memory transistor comprising a nanowire covered by a type of memory molecules and an access transistor of the same type. A source of the access transistor is connected to a drain of the memory transistor. The nanowire of the access transistor and the nanowire of the memory transistor can be formed by a single nanowire having two ends respectively forming a drain of the access transistor and a source of the memory transistor. The memory device comprises a plurality of memory cells, an access transistor gate being connected to a word line and a memory transistor gate being connected to a write line.

6 Claims, 6 Drawing Sheets

OTHER PUBLICATIONS

Levin, I. et al. "Growth Habits and Defects in ZnO Nanowires Grown on GaN/sapphire Substrates," *Applied Physics Letters*, vol. 87, 103110-1-103110-3 (2005).

Amara, A. "Design and Technology Interaction," Centre Si Seminar (Online), XP-002420711 (May 17, 2006), retrieved from URL: http://si.epfl.ch/webdav/site/si/shared/Seminar_Amara17_05_06.pdf>.

Li, C. et al. "Charge Storage Behavior of Nanowire Transistors Functionalized with Bis(terpyridine)-Fe(II) Molecules: Dependence on Molecular Structure," *J. Am. Chem. Soc.*, vol. 126, pp. 7750-7751 (2004).

Jalabert, A. "Architecture de mémoire haute densitéà base d'électronique moléculaire tolérante à un trés grand nombre de défauts," Internet Article (Nov. 9, 2006), retrieved from URL: http://pastel.paristech.org/bib/archie/00002014/01/these_jalabert_full_LR.pdf>.

\* cited by examiner

MEMORY CELL COMPRISING A MOLECULAR TRANSISTOR, DEVICE COMPRISING A PLURALITY OF SUCH CELLS AND METHOD FOR USING SAME

BACKGROUND OF THE INVENTION

The invention relates to a memory cell comprising a field effect memory transistor comprising a nanowire covered by a type of memory molecules.

STATE OF THE ART

Molecular memory cells present the advantage of being fast, compact and non-volatile and can be produced in simple manner using in particular self-assembly techniques. Molecular memory cells comprise a dipolar molecular component for storing binary or multivalued data.

Figure 1:
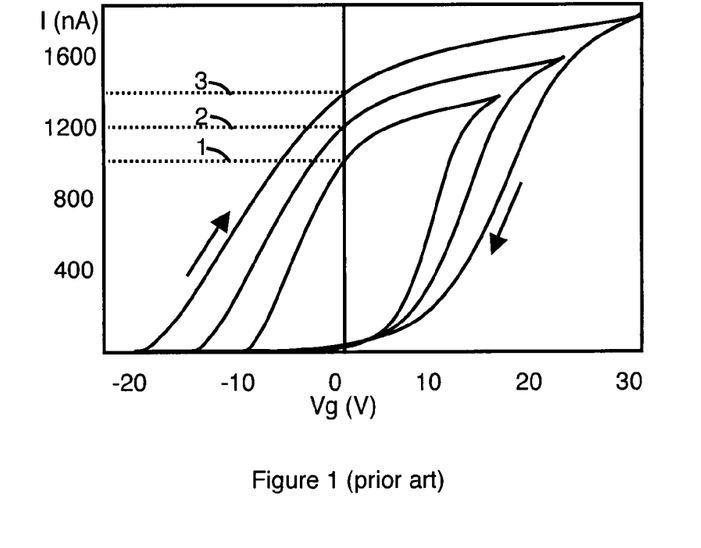
FIG. 1 represents the current/voltage characteristic of a molecular transistor according to the prior art.

The article "Multilevel memory based on molecular devices" by C. Li et al. (Applied Physics Letters, Vol. 84, No 11, 2004) describes a field effect memory transistor comprising a nanowire covered by memory molecules presenting several degrees of oxidation reduction representative of digital data (NWFET transistor: "Nano-wire Field Effect Transistor"). Data storing can be performed by modifying the degree of oxidation reduction, which influences the threshold voltage of the transistor. Read can be performed by measuring the conductance of the nanowire. As represented in FIG. 1, the characteristic of the current flowing in the transistor versus a gate voltage Vg, for a given source/drain voltage, presents a family of hysteresis loops corresponding to different degrees of oxidation reduction of the molecule population. In FIG. 1, for reasons of clarity, only three hysteresis loops are represented, but the molecular transistor can present more degrees of oxidation reduction, for example eight degrees, and therefore eight states representative of distinct data.

Data can thus be written by applying a negative write voltage to the transistor gate, for example a gate voltage of $-10V$, $-15V$ or $-20V$, enabling different conduction states 1, 2 or 3 of the memory transistor to be obtained when the gate voltage Vg is zero reset. The currents corresponding to the conduction states 1, 2 or 3 are in fact respectively about 1000 nA, 1200 nA and 1400 nA, in FIG. 1. The state 3, obtained by applying a write voltage of $-20V$, is therefore the most conducting state, i.e. a lowly resistive state.

The data can be erased by applying a positive erase voltage to the transistor gate, for example +30V. The system thus goes to state 3, at the right-hand end of the corresponding hysteresis curve of FIG. 1. After the gate voltage Vg has been reset, the current is thus nil, in accordance with the descending branch of the hysteresis curve, on the right of FIG. 1. In this state, the transistor is therefore highly resistive.

The written data can be read by applying a read voltage of about 0.01V between the transistor source and drain and maintaining the gate voltage at zero.

When such a memory transistor is integrated in a memory device organized in lines and columns, it is difficult to access the data contained in a predetermined transistor of the memory without disturbing the other transistors and/or without being disturbed by the signals from the other transistors connected to the same access conductors. The transistors can therefore not be accessed selectively, i.e. the transistors be distinguished from one another.

The document U.S. Pat. No. 6,944,047 describes different memory cells comprising a molecular memory transistor based on two types of molecules. The memory cell can be formed by the molecular transistor or by the combination of an access transistor and a molecular transistor. In the latter case, the source of the access transistor commands the molecular transistor gate.

Such a cell however only operates correctly when two types of molecules are used for the memory transistor. A first type of molecules is in particular required for data memory, and another type of molecules is required to keep the data.

OBJECT OF THE INVENTION

It is one object of the invention to provide a memory cell that is simple to produce and reliable for data access without deleting the data of another cell when read is performed, while providing a compact cell, to increase the interconnection density, and multivalued, i.e. a cell enabling several values to be stored on a single memory dot. The cell is selectable, i.e. it enables selective access to particular data without damaging the data contained in the other cells, in particular the neighboring cells.

According to the invention, this object is achieved by the fact that the memory cell comprises a field effect access transistor comprising a nanowire covered by the same type of memory molecules, a source of the access transistor being connected to a drain of the memory transistor.

According to a preferred embodiment of the invention, the nanowire of the access transistor and the nanowire of the memory transistor are formed by a single nanowire having two ends respectively forming a drain of the access transistor and a source of the memory transistor.

It is a further object of the invention to provide a memory device comprising a plurality of memory cells according to the invention, wherein an access transistor gate is connected to a word line and a memory transistor gate is connected to a write line.

According to a particular embodiment of the invention, a drain of the memory transistor is connected to an additional command line.

The device preferably comprises means for switching the access transistor to a first lowly resistive state in a read phase of data stored in the memory transistor, and means for switching the access transistor to a second highly resistive state.

It is yet a further object of the invention to provide a method for using the device according to the invention, comprising erase of the data stored in the memory transistor by:

simultaneously applying a zero voltage to the memory transistor source and an erase voltage to the memory transistor gate, and at the same time setting the access transistor drain and the access transistor gate to floating state, then applying a zero voltage to the memory transistor gate and to the access transistor gate, then applying a zero voltage to the access transistor drain.

The method can comprise data write in the memory transistor by:

simultaneously applying a zero voltage to the memory transistor source and to the access transistor gate and a write voltage to the memory transistor gate, and at the same time setting the access transistor drain to floating state, then applying a zero voltage to the memory transistor gate, then applying a zero voltage to the access transistor drain.

The method can comprise switching of the access transistor to the on state by:

simultaneously applying a zero voltage to the memory transistor source and to the access transistor drain and an on state voltage to the access transistor gate, and at the same time setting the memory transistor gate to floating state, then applying a zero voltage to the access transistor gate, then applying a zero voltage to the memory transistor gate.

The method can comprise data read in the memory transistor by:

applying a read voltage to the access transistor drain, then applying a zero voltage to the access transistor drain.

The method can comprise switching of the access transistor to the off state by:

applying an erase voltage to the access transistor gate and at the same time setting the memory transistor gate to floating state, then applying a zero voltage to the access transistor gate, then applying a zero voltage to the memory transistor gate.

The method can comprise successively:

switching of the access transistor to the on state, data read in the memory transistor, and switching of the access transistor to the off state.

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF A PREFERRED
EMBODIMENT OF THE INVENTION

Figure 2:
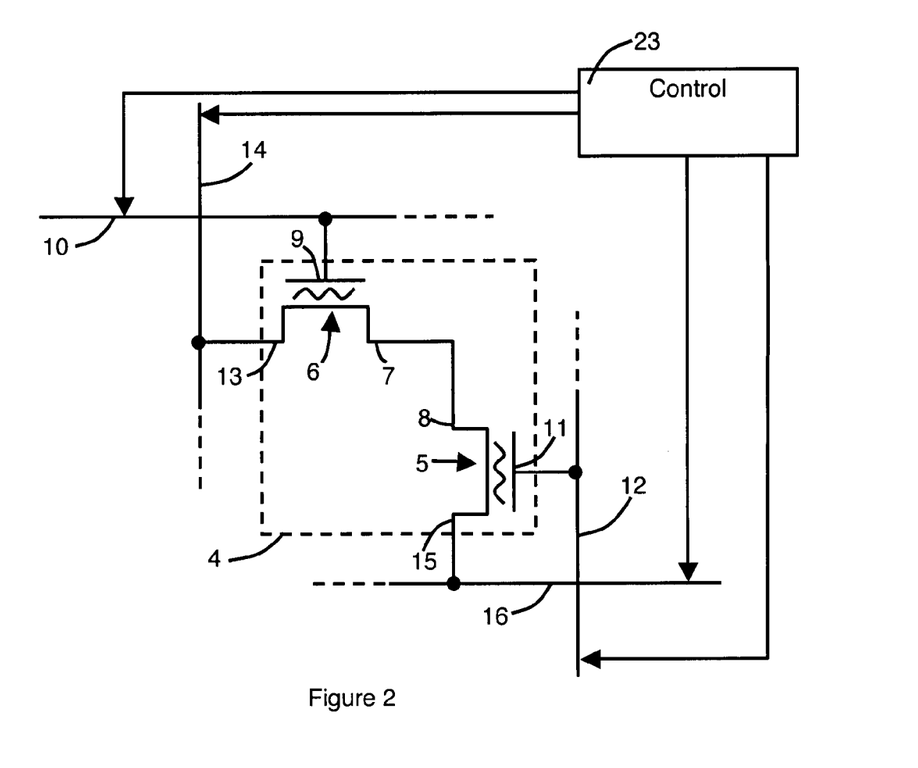
FIGS. 2, 3 and 6 illustrate three particular embodiments of a memory cell according to the invention and connection thereof to the device according to the invention.

The memory cell 4 represented in FIG. 2 comprises a field effect memory transistor 5 comprising a nanowire covered by one type of memory molecules and a field effect access transistor 6 comprising a nanowire covered by said type of memory molecules. The source 7 of the access transistor 6 is connected to the drain 8 of the memory transistor 5 in such a way that the memory cell 4 forms a quadripole.

In a memory device comprising a plurality of memory cells 4, the gate 9 of the access transistor 6 is connected to a word line 10 and the gate 11 of the memory transistor 5 is connected to a write line 12. The drain 13 of the access transistor 6 is connected to a read line 14 and a source 15 of the memory transistor 5 is connected to a source line 16.

Using the same type of transistor and a single type of molecules enables the memory cell 4 to be made very compact and easy to achieve.

Figure 3:
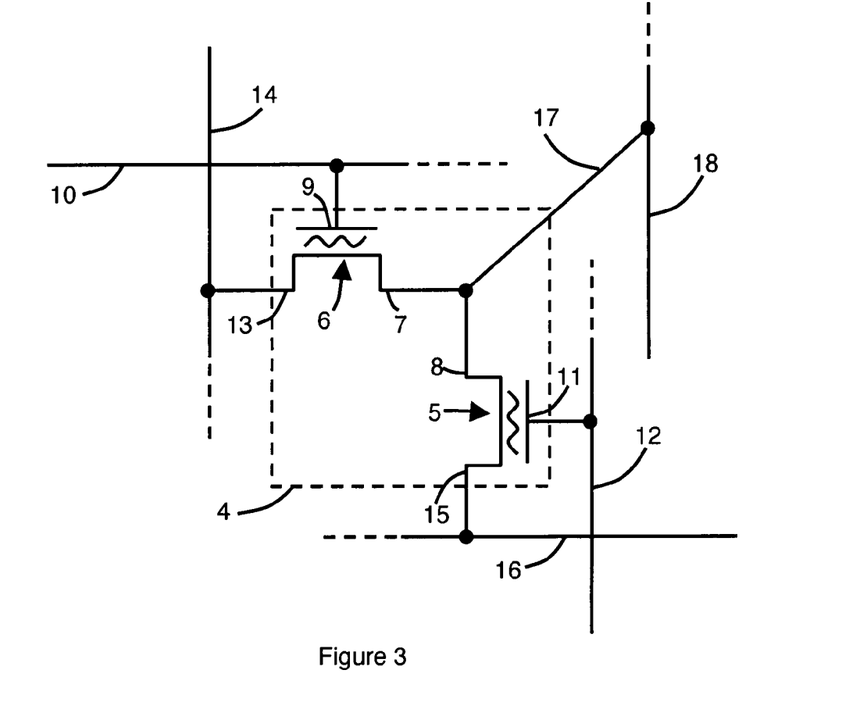

In FIG. 3, the source 7 of the access transistor 6 and the drain 8 of the memory transistor 5 form an additional electrode 17 connected to an additional command line 18, which makes the write operation independent from the access transistor 6 and, thereby speeds up the write and erase operations, while increasing the precision of programming of the memory transistor.

What is meant by nanowire is any long slender nano-object the characteristic dimensions whereof range from a nanometer to a hundred nanometers in its two smallest dimensions for lengths ranging from 0.5 to 10 microns. Thus a nanowire can be formed by macro-molecules, by crystalline or amorphous arrangements, by tubular or cylindrical shapes and, in particular, by a micro-structured semi-conducting strip or a carbon nanotube.

Figure 4:
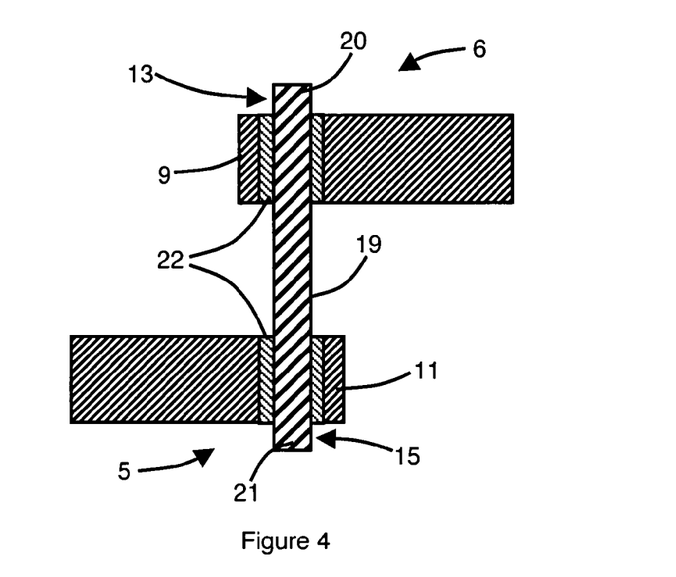
FIG. 4 represents a particular embodiment of the architecture of a memory cell according to the invention.

In FIG. 4, the nanowire of the access transistor 6 and the nanowire of the memory transistor 5 are formed by a single nanowire 19 having two ends 20 and 21 respectively forming a drain 13 of the access transistor 6 and a source 15 of the memory transistor 5. The gates 9 and 11 corresponding respectively to the access transistor 6 and to the memory transistor 5 are preferably cylindrical gates surrounding the nanowire 19. The gates 9 and 11 are separated from the nanowire by a gate insulator 22. The nanowire 19 is covered by molecules. A memory cell 4 able to store 4 data bits occupies for example a surface of 0.04 $\mu m^2$.

Figure 5:
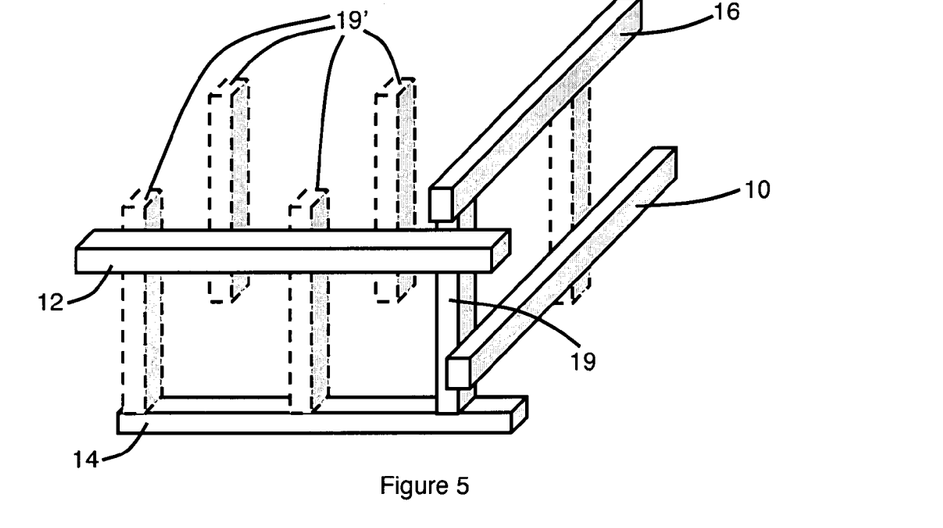
FIG. 5 represents a particular embodiment of integration of a memory cell according to the invention.

The cell represented in FIG. 4 enables a very compact device to be obtained. FIG. 5 represents an example of the spatial orientations of the read line 14, of the source line 16, of the word line 10 and of the write line 12 corresponding to the nanowire 19. The other corresponding lines in the adjacent nanowire 19' are not represented for reasons of clarity. Using a vertical alignment, i.e. perpendicular to the substrate, the length of the nanowire is no longer a constraint for the compactness of the device. A surface of 0.0004 $\mu m^2$ can thus be obtained for a memory cell with 3, 4 or 5 bits or more. Fabrication of vertical nanowires and functionalization thereof are known to the person skilled in the art. The nanowires can for example be produced by a method of the vapor-liquid-solid (VLS) type as described in the article "Growth habits and defects in ZnO nanowires grown on GaN/sapphire substrates" by I. Levin et al. (Applied Physics Letters, vol. 87, 103110, 2005).

The molecules covering the nanowire can for example be of the Bis(terpyridine)-Fe(II) type comprising a ligand performing the junction between the molecule and the nanowire. This molecule presents a pseudo-reversible electron transfer behavior, with a peak potential for the Bis(terpyridine)-Fe (II)/Bis(terpyridine)-Fe(II) oxidation reduction couple around 0.8-0.9V with respect to the Ag/AgNO$_3$ couple in acetonitrile.

The molecules covering the nanowire preferably present several degrees of oxidation reduction and comprise a ligand, implying an irreversible hysteresis cycle. The article "Charge Storage Behavior of Nanowire Transistors Functionalized with Bis(terpyridine)-Fe(II) Molecules: Dependence on Molecular Structure" by C. Li et al. (J. Am. Chem. Soc., vol. 126, 7750-7751, 2004) describes the influence of several ligands on irreversible hysteresis cycles. Thus, for each ligand, the characteristic of the current flowing through a transistor comprising the ligand can be measured as a function of a voltage applied to the gate electrode of the transistor. The measured current is naturally the current between drain and source. The characteristic corresponding to each ligand presents an irreversible hysteresis cycle having a certain amplitude at zero gate voltage, i.e. the amplitude of the hysteresis curve. By using certain ligands, known to the person skilled in the art, the amplitude of the irreversible hysteresis cycle is greater than one micro-Ampere, at least for one of the oxidation reduction levels of the molecule population, for example for the phenyl-thiolate ligand associated with the Bis(terpyridine)-Fe(II) molecule. According to the sensitivity of the current detection device, it is quite possible to envisage using molecules implying a substantially lower irreversible hysteresis cycle amplitude, for example 50 nA.

Using the Bis(terpyridine)-Fe(II) molecule, eight hysteresis cycles can be obtained by varying the gate potential from $-n*2.5V$ to $10+n*2.5V$ where n is the state index which can take integer values between 1 and 8.

The nanowire is for example a monocrystalline nanowire made from indium oxide $In_2O_3$ having a width of 10 nm, which can be produced by laser ablation. It is then grafted between two electrodes and functionalization thereof is pursued by immersion in a solution of 0.5 mM of molecules which are thus absorbed at the surface of the nanowire.

For satisfactory operation of the device, the access transistor 6 is switched to a first, lowly resistive state, in a read phase of data stored in the memory transistor 5. Thus, a transistor presenting the hysteresis curves illustrated in FIG. 1 can be switched to state 3, on the rising part of the corresponding curve. The transistor is thus in its most conducting state (transistor on), in particular for a zero gate voltage.

For the other phases, the access transistor 6 can be switched to a second, highly resistive state, by applying an erase voltage. In its second state, the access transistor 6 is thus off. Switching of the access transistor 6 to the first and second state is managed by a control circuit supplying the corresponding voltages. The memory transistor 5 is always in a programmed state representative of data including the state obtained by application of an erase voltage.

Figure 6:
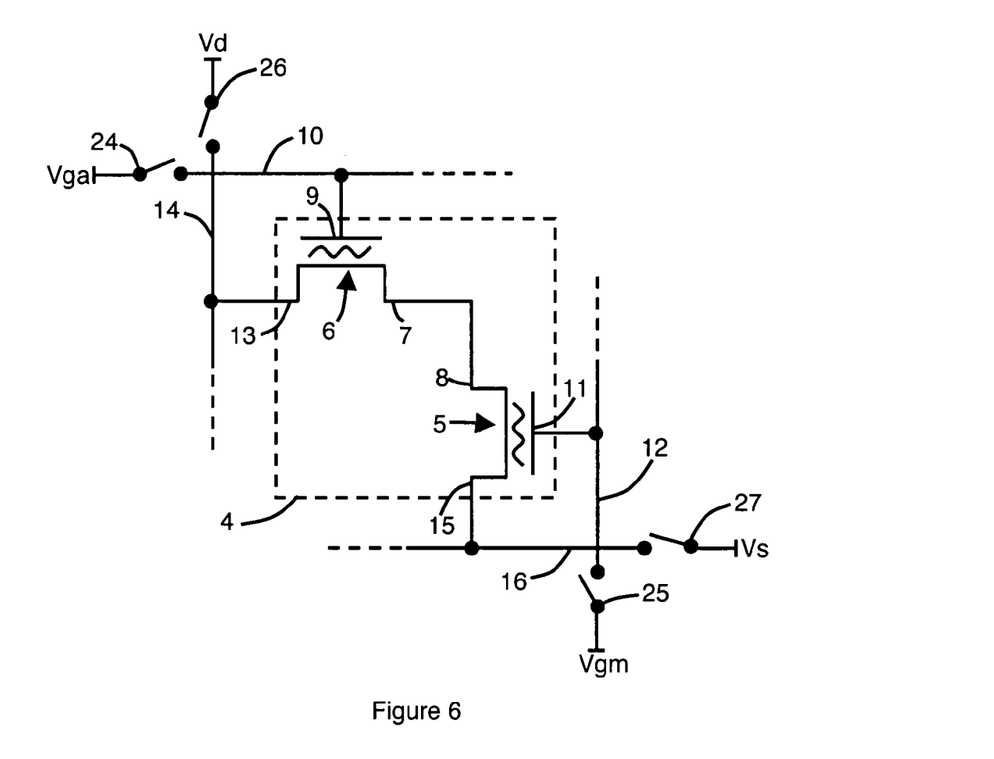

The command lines 10, 12, 14 and 16 represented in FIG. 6 are respectively connected to voltage sources by means of four switches 24, 25, 26 and 27. Thus, a gate voltage Vga of the access transistor 6 is applied to the word line 10, and thereby to the gate 9, by means of a switch 24. A gate voltage Vgm of the memory transistor 5 is applied to the write line 12, and thereby to the gate 11, by means of a switch 25. A drain voltage Vd of the access transistor 6 is applied to the read line 14, and thereby to the drain 13, by means of a switch 26. A source voltage Vs of the memory transistor 5 is applied to the source line 16, and thereby to the source 15, by means of a switch 27.

To apply a predetermined voltage to a corresponding terminal, the corresponding switch is preferably closed, after the predetermined voltage has been established at the corresponding voltage source. Thus, the potential of the selected terminal is established directly at the level of the required voltage. When one of the terminals (the gates 9 and 11, the source 15 or the drain 13) must be floating, the corresponding switch must be open. The switches 24, 25, 26 and 27 are preferably located as close as possible to the corresponding command lines to minimize stray capacitance effects.

Figure 7:
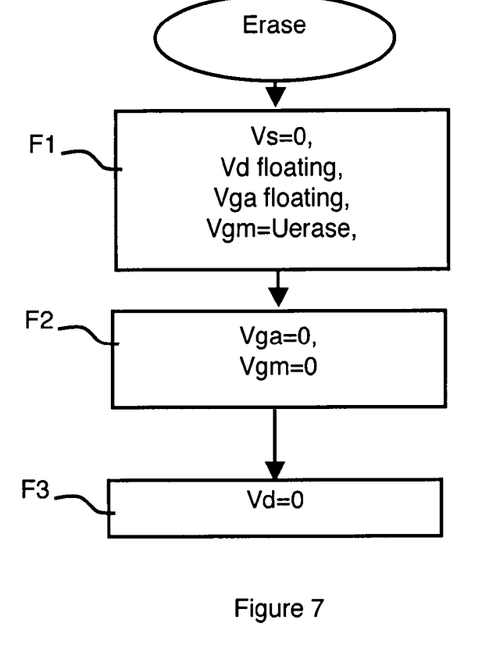
FIGS. 7 to 12 represent particular embodiments of different phases of a method for using the memory cell according to the invention.

The method for using the device comprises erase of the data stored in the memory transistor 5 by the following steps. As illustrated in FIG. 7, in a step F1, a zero voltage is simultaneously applied to the source 15 of the memory transistor 5 and an erase voltage Uerase is applied to the gate 11 of the memory transistor 5. The drain voltage Vd of the access transistor 6 and the gate voltage of the access transistor 6 are floating during the step F1. Then a zero voltage is applied to the gate 11 of the memory transistor 5 and to the gate 9 of the access transistor 6 (step F2). Then a zero voltage is applied to the drain 13 of the access transistor 6 (F3).

The erase voltage is for example a positive voltage of +30V in the case of a Bis(terpyridine)-Fe(II) transistor. A time delay is scheduled between the steps, the duration thereof being established according to the required application. The time delay can for example be about one nanosecond for multimedia applications or about one second for applications in the space field, when maximum data reliability has to be ensured.

Figure 8:
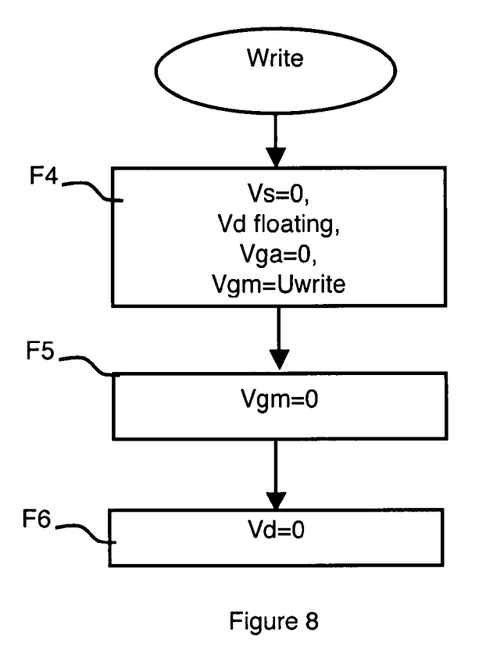

In accordance with FIG. 8, write of data in the memory transistor 5 is started by simultaneous application of a zero voltage to the source 15 of the memory transistor 5 and to the gate 9 of the access transistor 6 and of a write voltage Uwrite to the gate 11 of the memory transistor 5 (F4). The drain voltage Vd of the access transistor 6 is floating during the step F4. The step F4 corresponds to application of the voltage to program the memory transistor. A zero voltage is then applied to the gate 11 of the memory transistor 5 (F5). Then a zero voltage is applied to the drain 13 of the access transistor 6 (F6). The two steps F5 and F6 together correspond to the zero reset of the voltages. By using the Bis(terpyridine)-Fe(II) molecule, the write voltage is fixed, for example by the expression $n*(-2.5V)$, where n is an integer between 1 and 8.

The erase and write phases are similar, the main difference being the voltage Vgm (Uerase or Uwrite) applied to the gate 11 of the memory transistor 5. In both the erase and write phases, a zero voltage has to be applied to the source 15 of the memory transistor 5. For write, a zero voltage must be applied to the gate 9 of the access transistor 6.

Selective read preferably comprises a read phase of the data stored in the memory transistor 5 proper (FIG. 10) and two additional phases: an initial phase (FIG. 9) to turn the access transistor 6 on, and a final phase (FIG. 11) to turn the access transistor 6 off once the current read has been performed.

Figure 9:
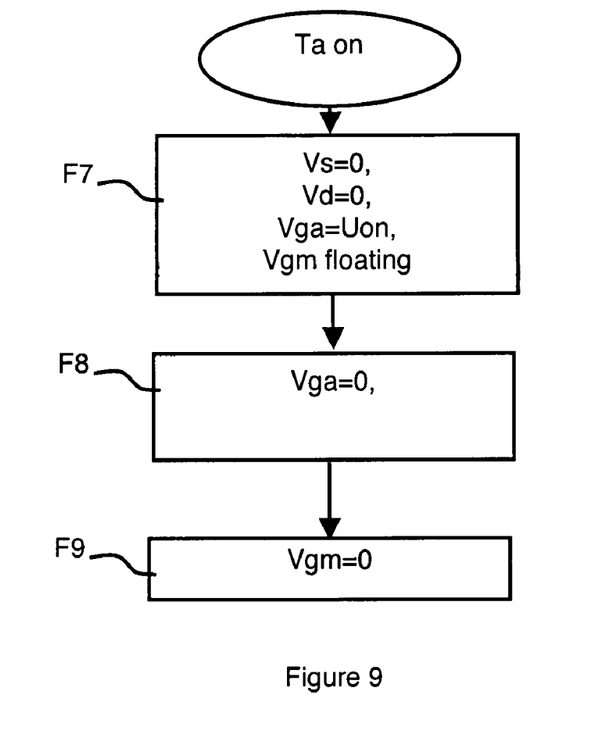

Switching of the access transistor 6 to the on state can be started by simultaneous application of a zero voltage to the source 15 of the memory transistor 5 and to the drain 13 of the access transistor 6 and of an on state voltage Uon to the gate 9 of the access transistor 6 (F7 in FIG. 9). The gate electrode voltage of the memory transistor 5 is floating during the step F7. A zero voltage is then applied to the gate 9 of the access transistor 6 (F8). Then a zero voltage is applied to the gate 11 of the memory transistor 5 (F9). In the example of the Bis(terpyridine)-Fe(II) molecule, the on state voltage is Uon=−20V.

Data read in the memory transistor 5 preferably comprises a first step of application of a read voltage Uread to the drain 13 of the access transistor 6 (F10 in FIG. 10) and a second step of application of a zero voltage to the drain 13 of the access transistor 6 (F11). The read voltage Uread is about 0.01 V and for example 75 mV.

Figure 11:
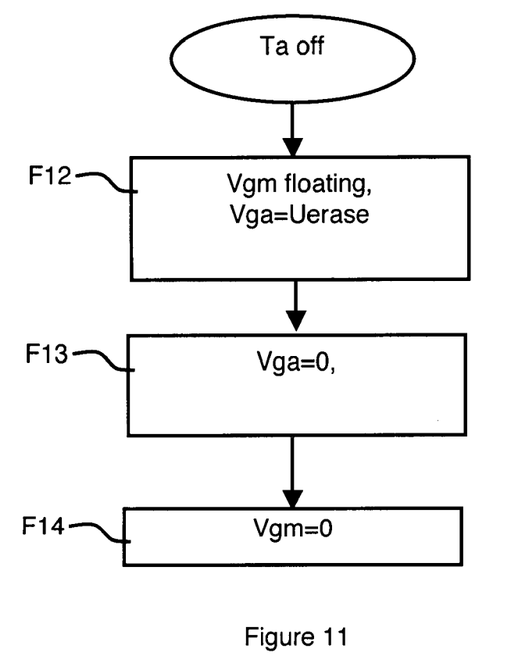
Figure 12:
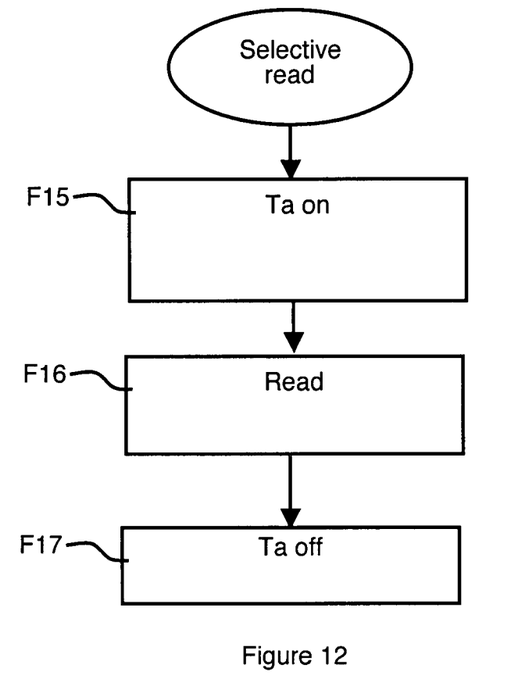

Switching of the access transistor to the off state preferably comprises application of an erase voltage Uerase to the gate 9 of the access transistor 6 and, at the same time, setting the gate 11 of the memory transistor 5 to the floating state (F12 in FIG. 11). A zero voltage is then applied to the gate 9 of the access transistor 6. A zero voltage is then applied to the gate 11 of the memory transistor 5.

Figure 10:
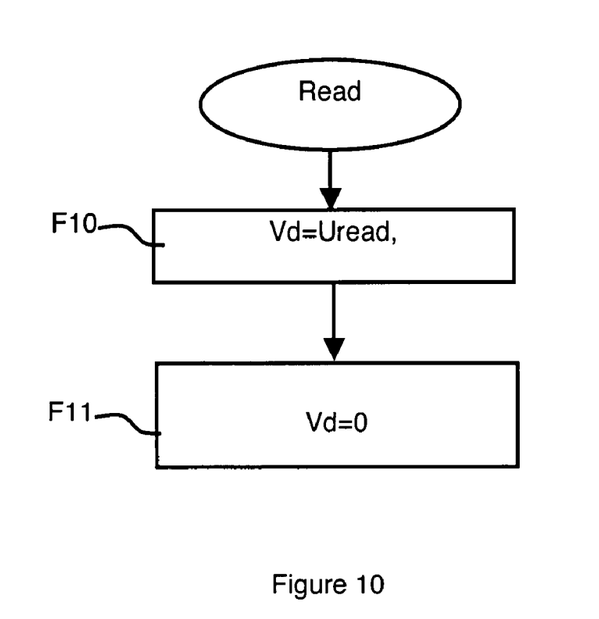

To read the data stored in the memory transistor selectively without disturbing adjacent memory cells, the phases represented in FIGS. 9, 10 and 11 are carried out successively, i.e. the switching phase of the access transistor to the on state (F15) is performed first, followed by the data read phase in the memory transistor 5 (F16) and then the switching phase of the access transistor 6 to the off state.

The memory cell 4 can thus be managed by means of a set of four lines: the word line, the write line, the read line and the source line, which are respectively connected to a line address decoder, a write analog-to-digital converter, a read analog-to-digital converter and a main control block 23, represented in FIG. 2. The memory device thus comprises a series of write analog-to-digital converters, a series of read analog-to-digital converters, a line address decoder and a main control block.

The main control block performs control of the set of control lines. The device preferably comprises additional cells designed for error correction.

The invention claimed is:

1. A method for using a memory device comprising a plurality of memory cells, each memory cell comprising:
    a field effect memory transistor comprising a nanowire covered by a type of memory molecules,
    a field effect access transistor comprising a nanowire covered by the same type of memory molecules,
    a source of the access transistor connected to a drain of the memory transistor,
    an access transistor gate connected to a word line, and
    a memory transistor gate connected to a write line;
  the method comprising:
    erasing data stored in the memory transistor by:
      simultaneously applying a zero voltage to a memory transistor source and an erase voltage to the memory transistor gate, and at the same time setting an access transistor drain and the access transistor gate to floating state,
      then applying a zero voltage to the memory transistor gate and to the access transistor gate, and
      then applying a zero voltage to the access transistor drain.

2. The method according to claim 1, comprising writing data in the memory transistor by:
    simultaneously applying a zero voltage to the memory transistor source and to the access transistor gate and a write voltage to the memory transistor gate, and at the same time setting the access transistor drain to floating state,
    then applying a zero voltage to the memory transistor gate, and
    then applying a zero voltage to the access transistor drain.

3. The method according to claim 1, comprising switching of the access transistor to the on state by:
    simultaneously applying a zero voltage to the memory transistor source and to the access transistor drain and an on state voltage to the access transistor gate, and at the same time setting the memory transistor gate to floating state,
    then applying a zero voltage to the access transistor gate, and
    then applying a zero voltage to the memory transistor gate.

4. The method according to claim 1, comprising reading data in the memory transistor by:
    applying a read voltage to the access transistor drain, and
    then applying a zero voltage to the access transistor drain.

5. The method according to claim 1, comprising switching of the access transistor to the off state by:
    applying an erase voltage to the access transistor gate and at the same time setting the memory transistor gate to floating state,
    then applying a zero voltage to the access transistor gate, and
    then applying a zero voltage to the memory transistor gate.

6. The method according to claim 1, successively comprising:
    switching of the access transistor to the on state,
    reading data in the memory transistor, and
    switching of the access transistor to the off state.

* * * * *